United States Patent [19]
Ali et al.

[11] Patent Number: 6,075,701
[45] Date of Patent: Jun. 13, 2000

[54] ELECTRONIC STRUCTURE HAVING AN EMBEDDED PYROLYTIC GRAPHITE HEAT SINK MATERIAL

[75] Inventors: M. Akbar Ali, Lomita; Carl W. Peterson, Carson; Kevin M. McNab, Rancho Palos Verdes, all of Calif.

[73] Assignee: Hughes Electronics Corporation, El Segundo, Calif.

[21] Appl. No.: 09/312,460

[22] Filed: May 14, 1999

[51] Int. Cl.[7] ........................................ H05K 7/20
[52] U.S. Cl. .................... 361/704; 361/706; 361/707; 361/705; 361/708; 361/709; 361/710; 361/717; 174/252; 174/256; 257/720; 428/320.2; 428/614; 428/634
[58] Field of Search ................................ 361/689, 690, 361/704–710, 717, 718; 257/706, 712; 165/80.2, 80.3, 185; 428/320.2, 322.7, 378; 174/252

[56] References Cited

U.S. PATENT DOCUMENTS

| | | |
|---|---|---|
| 2,820,751 | 1/1958 | Saller . |
| 3,328,642 | 6/1967 | Haumesser et al. . |
| 3,427,706 | 2/1969 | Jaffee . |
| 3,616,115 | 10/1971 | Klimmek . |
| 3,678,995 | 7/1972 | Collard . |
| 4,372,804 | 2/1983 | Hanabusa et al. . |
| 4,482,912 | 11/1984 | Chiba et al. . |
| 4,500,589 | 2/1985 | Schijve et al . |
| 4,536,435 | 8/1985 | Utsumi et al. . |
| 4,578,308 | 3/1986 | Hani et al. . |
| 4,601,941 | 7/1986 | Lutz et al. . |
| 4,615,945 | 10/1986 | Iida . |
| 4,640,065 | 2/1987 | Harris et al. . |
| 4,675,246 | 6/1987 | Kundinger et al. . |
| 4,878,152 | 10/1989 | Sauzade et al. . |
| 4,888,247 | 12/1989 | Zweben et al. . |
| 4,990,402 | 2/1991 | Kneringer et al. . |
| 4,996,115 | 2/1991 | Eerkes et al. . |
| 4,996,116 | 2/1991 | Webster et al. . |
| 5,039,577 | 8/1991 | Knoell et al. . |
| 5,224,030 | 6/1993 | Banks et al. ............................ 361/704 |
| 5,296,310 | 3/1994 | Kibler et al. ............................ 428/614 |
| 5,520,976 | 5/1996 | Giannetti et al. ...................... 428/36.3 |
| 5,695,847 | 12/1997 | Browne .................................. 428/112 |
| 5,849,130 | 12/1998 | Browne .................................. 156/256 |
| 5,876,831 | 3/1999 | Rawal .................................... 428/117 |
| 5,958,572 | 9/1999 | Schmidt et al. ...................... 428/320.2 |

OTHER PUBLICATIONS

Advanced Ceramics Corp., "Product Overview" and Data Sheets on products (9 pages total), undated.

Mark J. Montesano et al., "Demonstration of a High Conductivity, Low Mass Density Thermal Management Material System with an Engineered Thermal Expansion", (5 pages total), undated.

Robert Klaiber et al., "Critical Issues in Electronic Packaging Assembly, Part I", *Circuits Assembly*, Dec. 1995, pp. 30–33.

M.A. Lambert et al., "Thermal Conductivity of Graphite/Aluminum and Graphite/Cooper Composites", *Transactions of the ASME–Journal of Heat Transfer*, May 1996, pp. 478–480.

Anon, "Advanced Packagin State of the Industry", *Advanced Packaging*, Jul./Aug. 1997, pp. 25, 27, 30, and 36.

*Primary Examiner*—Leo P. Picard
*Assistant Examiner*—Boris H. Chervinsky
*Attorney, Agent, or Firm*—Terje Gumestad; M. W. Sales

[57] ABSTRACT

An electronic structure includes an electronic device, and a heat sink assembly in thermal contact with the electronic device. The heat sink assembly is formed of a piece of pyrolytic graphite embedded within a metallic casing and intimately contacting an interior wall of the metallic casing. The heat sink assembly is substantially fully dense. The heat sink assembly is fabricated by assembling the piece of pyrolytic graphite within the disassembled elements of the metallic casing, and then simultaneously heating and pressing the initial assembly until it is substantially fully dense.

14 Claims, 3 Drawing Sheets

ELECTRONIC STRUCTURE HAVING AN EMBEDDED PYROLYTIC GRAPHITE HEAT SINK MATERIAL

BACKGROUND OF THE INVENTION

This invention relates to an electronic structure and, more particularly, to an electronic structure having a high-conductivity heat sink therein.

Many electronic devices such as integrated circuits, solid state power amplifiers, and antennas produce substantial amounts of heat when in service. The heat must be redistributed and ultimately conducted away, or the resulting temperature rise may result in the maximum operating temperature limit of the electronic device being exceeded. If the maximum operating temperature limit is exceeded, performance of the electronic device is degraded or the device may fail.

Removal of excess heat is readily accomplished in some situations, but is much more difficult in others. In spacecraft such as communications satellites, for example, many components are made as small and as light as possible to conserve space and payload capacity during launch. High-power-handling electronic devices such as microwave processors and amplifiers are concentrated into small spaces in the interior of the satellite. Heat produced by these electronic devices is conducted away to radiators on the spacecraft exterior. In some satellites, heat removal may be a limiting consideration in the continuing attempts to reduce volume and weight of the electronic systems.

The electronic device is usually supported on a substrate and may be within a closed package. The initial stages of heat removal require that the heat produced by the electronic device be conducted away from its immediate vicinity through the substrate and/or the package structure. In the past, ceramic materials such as aluminum oxide, which have low thermal conductivities, have been used for substrates and packages. More recently, metallic and composite materials have served as heat sinks in substrates and packages. These materials have higher thermal conductivities than ceramics, so that they are more efficient in conducting heat away from the electronic device. However, for some applications even higher thermal conductivities would be desirable.

There remains a need for continued improvement in materials used for heat-sinking roles in electronic structures. The present invention fulfills this need, and further provides related advantages.

SUMMARY OF THE INVENTION

The present invention provides an electronic structure including an electronic device and a highly efficient heat sink assembly, and a method for fabricating such an electronic structure. A wide variety of active and passive electronic devices may be used. The heat sink is readily fabricated as a closed, integral unit. The heat sink is structured to achieve a very high thermal transfer rate, both to redistribute heat concentrations and to conduct heat away from the electronic device. The heat sink is highly resistant to corrosion and other adverse environmental influences.

In accordance with the invention, an electronic structure comprises an electronic device, and a heat sink assembly in thermal contact with the electronic device. The heat sink assembly comprises apiece of pyrolytic graphite embedded within a casing and intimately contacting an interior wall of the casing. The heat sink assembly is substantially fully dense.

In one preferred form, the heat sink assembly comprises a first preform, a second preform oriented parallel to the first preform, and the piece of pyrolytic graphite disposed between and intimately contacting the first preform and the second preform. Where necessary to complete the enclosure of the heat sink, a lateral wall encloses the periphery of the piece of pyrolytic graphite and is joined to the preform. In another preferred form, the heat sink assembly includes a hollow cavity in which the pyrolytic graphite is received, and which is then closed to embed the pyrolytic graphite within the heat sink structure.

The pyrolytic graphite is available in a sheetlike form, which has a high thermal conductivity in the plane of the sheet and a lower thermal conductivity perpendicular to the plane of the sheet. In one form, the pyrolytic graphite is oriented such that the high-conductivity plane lies parallel to the preforms or face of the cavity. In another form, the sheet of pyrolytic graphite is cut into slices or otherwise provided such that it may be oriented with its high-conductivity plane at an angle of more than 0 degrees to the plane of the preform or face of the cavity, and as high as about 90 degrees to the plane of the preform or face of the cavity. The heat sink assembly is thereby tailored to specific heat flow requirements of the electronic device.

The casing of the heat sink is preferably a metal, and most preferably aluminum, copper, or silver, or alloys thereof. (As used herein, reference to a metal includes both the substantially pure metal and alloys of the metal containing at least about 50 percent by weight of the metal, unless otherwise indicated. That is, "aluminum" includes both pure aluminum and alloys thereof.) The casing is preferably hermetic, and is sealed against intrusion of external corrosive agents.

The electronic structure is preferably fabricated by furnishing at least one piece of pyrolytic graphite and a set of disassembled elements of a casing, and assembling the at least one piece of pyrolytic graphite within the interior of the disassembled elements of the casing positioned so as to form an initial assembly. The initial assembly is placed into a vacuum sealed can or canister. The can is then placed into an elevated-pressure device. The method further includes heating and simultaneously applying pressure to the initial assembly using the elevated temperature pressing device until a resulting heat sink assembly is substantially fully dense. The result is a fully dense, hermetically sealed heat sink assembly, to which the electronic device is affixed. This approach to manufacturing electronic structures is economical and well suited to large-scale production.

When the electronic device is operated, heat flows into the casing of the heat sink assembly and thence into the pyrolytic graphite embedded within the heat sink assembly. There is an intimate interface between the casing and the pyrolytic graphite, so that there is little thermal impedance to the rapid dissipation of the heat. Because the heat produced by the electronic device is rapidly conducted away, the electronic device may be operated to higher power levels than possible with other types of heat sink structures. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 2A–2C are detailed sectional views of three heat sink assemblies, wherein FIG. 2A depicts the high conductivity plane of the pyrolytic graphite parallel to the preforms, FIG. 2B depicts the high conductivity plane of the pyrolytic graphite inclined to the preforms, and FIG. 2C depicts the high conductivity plane perpendicular to the preforms;

FIGS. 3A–3C are schematic sectional views of interfaces between a preform and a pyrolytic graphite layer, wherein FIG. 3A depicts the approach of the present invention, FIG. 3B depicts a first prior approach, and FIG. 3C depicts a second prior approach;

DETAILED DESCRIPTION OF THE INVENTION

Figure 1:
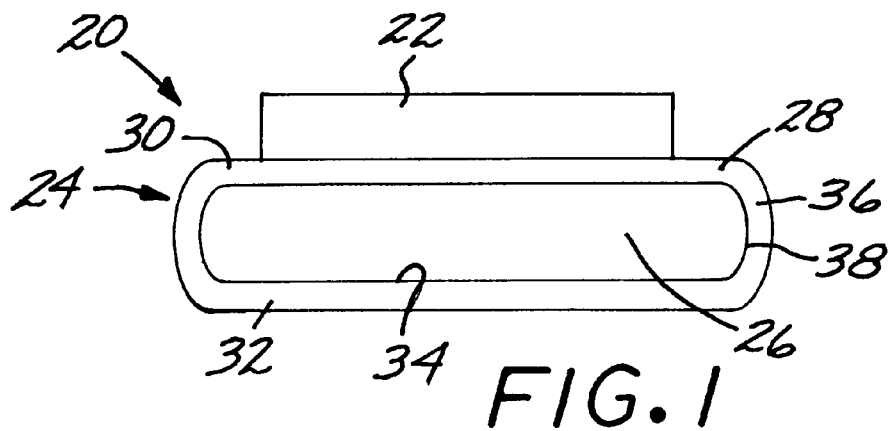
FIG. 1 is a sectional view of a general form of an electronic structure according to the invention.

FIG. 1 illustrates an electronic structure 20 in a general form. The electronic structure 20 includes an electronic device 22 which may be of any type, such as, for example, an integrated circuit, a power amplifier, or an antenna. The electronic device 22 produces heat that must be dissipated and conducted away. The present invention is not concerned further with the details of structure of the electronic device 22, except as may be discussed subsequently, and such electronic devices are known in the art.

The electronic structure 20 further includes a heat sink assembly 24 in thermal communication with the electronic device 22. As illustrated, the heat sink assembly 24 is in direct contact with the electronic device 22 to achieve thermal communication. Equivalently for the present purposes, the heat sink assembly 24 may be in thermal communication with the electronic device 22 by other means, such as an intermediate solid thermal conductor, a heat pipe, or the like.

The heat sink assembly 24 includes a piece of pyrolytic graphite 26 embedded within a casing 28. Pyrolytic graphite is a form of graphite typically prepared by chemical vapor deposition and post processing of carbon, resulting in an article having a plane of high thermal conductivity in the direction parallel to a substrate upon which the carbon is deposited. The pyrolytic graphite has a thermal conductivity of greater than about 1500 watts per meter-° K, and typically about 1700–1750 watts per meter-° K, in the plane of high thermal conductivity. Suitable pieces of pyrolytic graphite for use in the present invention are available commercially from suppliers such as B.F. Goodrich, Inc.

The casing 28 is preferably made of a high conductivity metal such as aluminum, copper, or silver (and their alloys). The casing 28 extends around and encloses the pyrolytic graphite piece 26, so that the pyrolytic graphite piece 26 is embedded within the casing 28. Preferably, the casing 28 is hermetic, so that no external agents such as oxidants and corrodants can penetrate therethrough to contact the pyrolytic graphite piece 26.

In one form, the casing 28 includes a first preform 30 and a second preform 32 positioned parallel to the first preform 30. In the illustrated embodiment, the preforms are planar face sheets, but they may be more complex, shaped elements such as housings. The pyrolytic graphite piece 26 is positioned between and in proximity to the interiorly facing surfaces 34 of the first preform 30 and the second preform 32. A lateral wall 36 encloses a periphery 38 of the pyrolytic graphite piece 26. The lateral wall 36 may be formed of a piece of the same material as the preforms or preforms 30 and 32, or it may be formed by pinning in the sides of the preforms or preforms 30 and 32 until they contact each other in the desired geometry. Other materials may also be embedded within the assembled configuration to form passive microwave distribution devices.

Figure 2A:
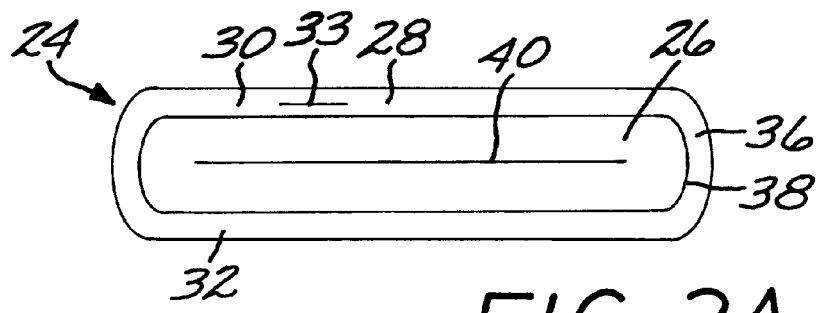
Figure 2B:
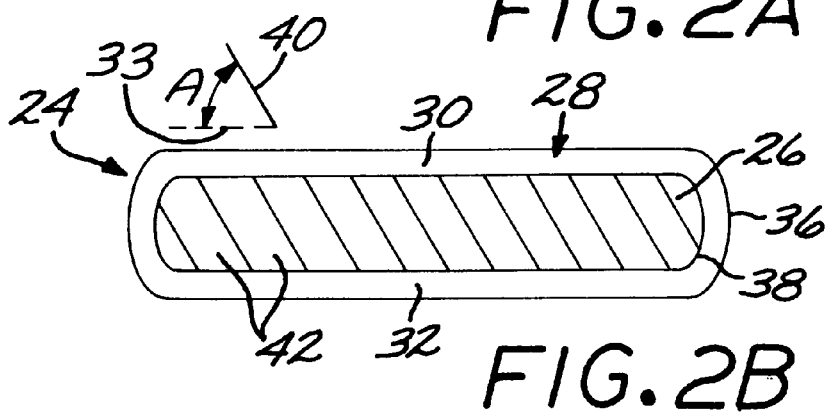
Figure 2C:
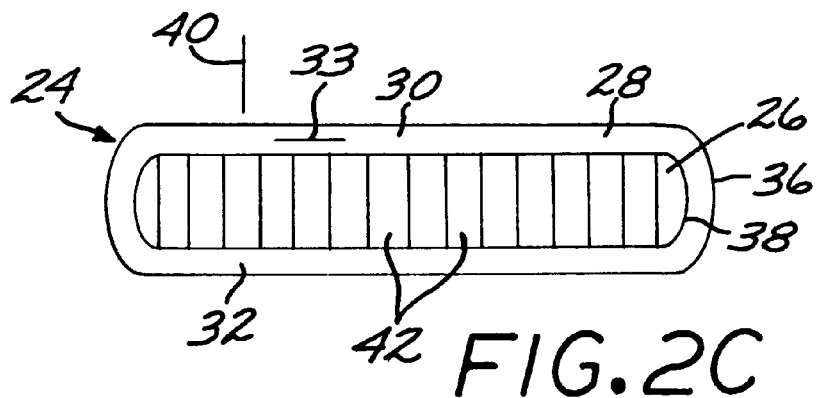

The pyrolytic graphite piece 26 may be positioned in any of several orientations within the casing 28, as illustrated in FIGS. 2A–2C. These allow the direction of high thermal conductivity to be oriented in any desired direction for particular applications. In FIG. 2A, a plane of high thermal conductivity 40 is oriented parallel to a plane 33 lying parallel to the surface of the preforms 30 and 32 which contacts the pyrolytic graphite piece 26. Heat is rapidly conducted from the center toward the sides of the heat sink assembly 24. In FIG. 2B, the plane of high thermal conductivity 40 is oriented at an angle A of more than 0 and up to and including 90 degrees to the plane 33 of the preforms 30 and 32 which contacts the pyrolytic graphite piece 26. In FIG. 2C, the plane of high thermal conductivity 40 is oriented at about 90 degrees to the plane 33 of the preforms 30 and 32 which contacts the pyrolytic graphite piece 26. Heat is rapidly conducted from the electronic device 22 downwardly through the heat sink assembly 24 to its bottom surface. The pyrolytic graphite piece 26 of FIG. 2A is typically a single large flat sheet or plate, which is available in that form by virtue of the method of fabrication of the piece 26. The pyrolytic graphite pieces 26 of FIGS. 2B and 2C may be made as thick single pieces of material and cut to shape. More preferably, the pieces 26 of FIGS. 2B and 2C are made by cutting a piece such as shown in FIG. 2A into slices 42, and then stacking the slices 42 in a side-by-side fashion during fabrication of the heat sink assembly 24.

Figure 3A:
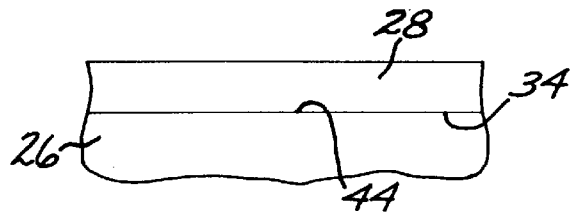

A surface 44 of the pyrolytic graphite piece 26 is in intimate physical contact with the interiorly facing surface 34 of the casing 28, as illustrated in FIG. 3A. This intimate physical contact may be accompanied by chemical reaction or close physical contact at the interface between surfaces 34 and 44. The intimate thermo-mechanical physical contact ensures good thermal conduction between the surface 34 and the surface 44, and thence between the casing 28 and the pyrolytic graphite piece 26.

Figure 3B:
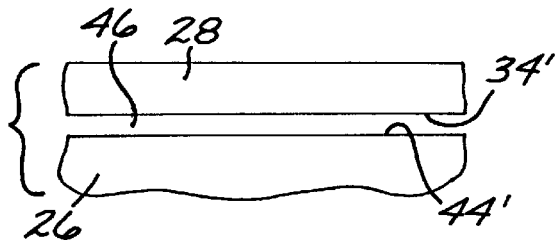
Figure 3C:
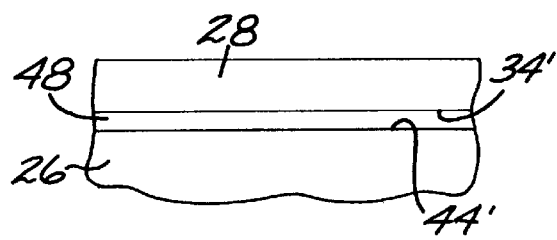

By contrast, two alternative approaches, which are not acceptable for the present electronic structure, are illustrated in FIGS. 3B and 3C. In FIG. 3B, there is a space 46 (produced by a spacer, not shown) between the casing 28 and the pyrolytic graphite piece 26. In FIG. 3C, there is a separate piece of material, such as a shear layer 48, sandwiched between the casing 28 and the pyrolytic graphite piece 26. In the structures of each of FIGS. 3B and 3C, the intervening element—the space 46 or the shear layer 48—adds a large thermal impedance to the heat flow between the casing 28 and the pyrolytic graphite piece 26. The present electronic structure 20 of FIG. 1, whose interfacing structure is illustrated in FIG. 3A, is designed for maximum thermal transmission, and therefore the approaches of FIGS. 3B and 3C are not acceptable for its practice.

Figure 5:
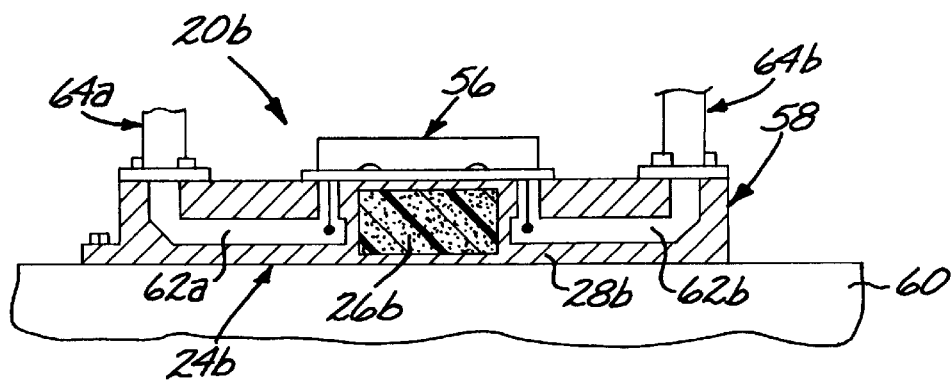
FIG. 5 is a sectional view of an electronic structure including a solid state power amplifier.
Figure 6:
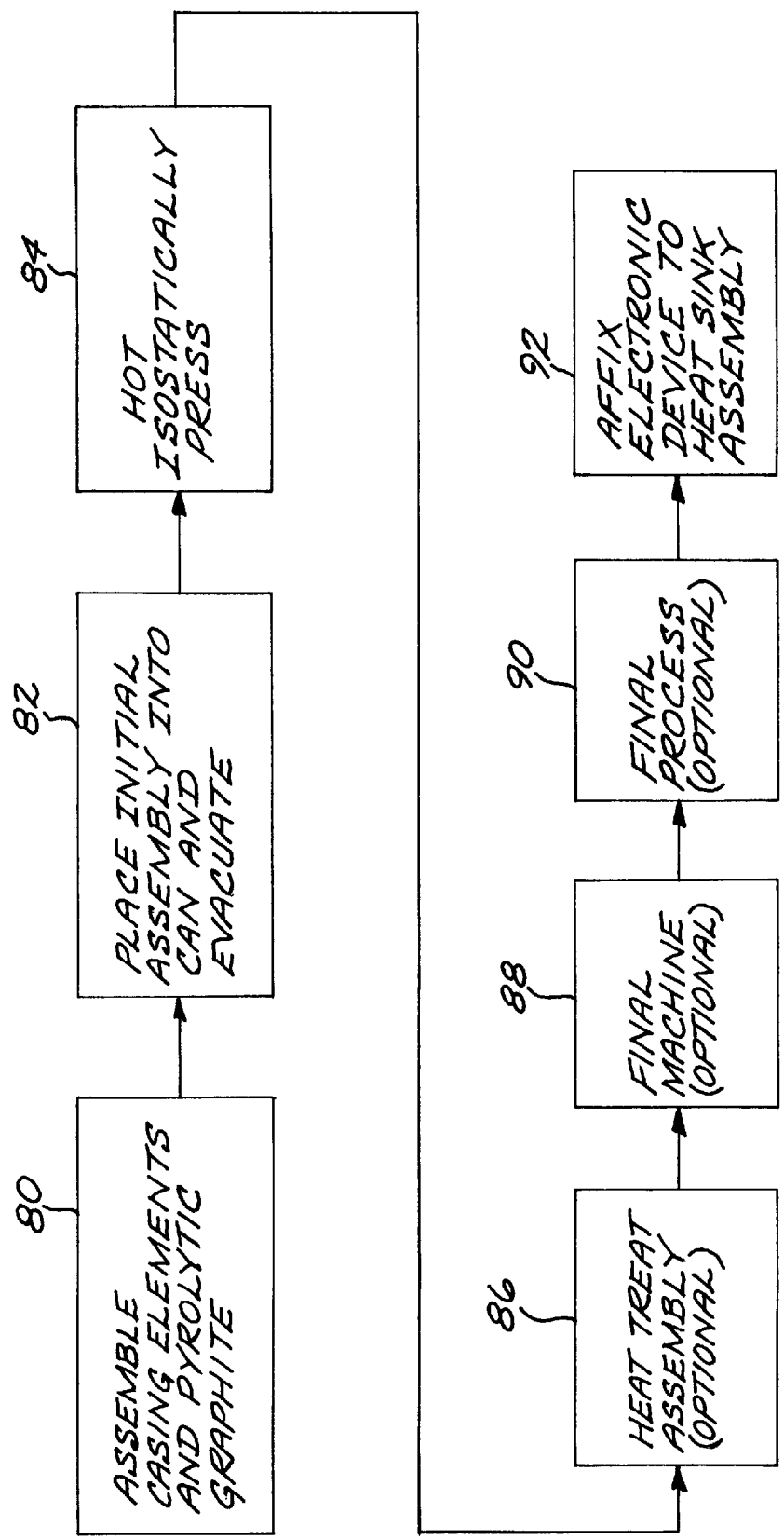
FIG. 6 is a block flow diagram of a preferred approach for preparing an electronic structure according to the invention.

The electronic device structure 20 of FIG. 1 is presented in a general form. FIGS. 5 and 6 illustrate two specific types of such structures, showing some features of the piece 26 and the casing 28 as applied to specific applications. In the following discussion, the same numbers, but with suffixes, are assigned to elements corresponding to those of FIG. 1, and that description is incorporated here.

Figure 4:
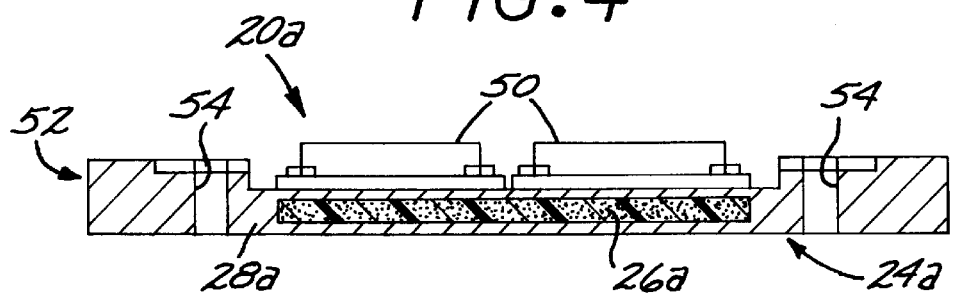
FIG. 4 is a sectional view of an electronic structure including a microelectronic integrated circuit.

In an electronic structure 20a of FIG. 4, two integrated circuits 50 are affixed to a top surface of a base 52. The base 52 serves as the casing 28a of the heat sink assembly 24a. A thin, platelike pyrolytic graphite piece 26a is embedded in the casing 28a, with the plane of high thermal conductivity of the pyrolytic graphite piece 26a oriented as shown in FIG. 2A. Attachment holes 54 are machined into the base 52.

In an electronic structure 20b of FIG. 5, a solid state power amplifier 56 is affixed to a top surface of a base 58. The base 58 serves as the casing 28b of the heat sink assembly 24b. A thick, relatively narrow pyrolytic graphite piece 26b is embedded in the casing 28b, with the plane of high thermal conductivity of the pyrolytic graphite piece 26b oriented as shown in FIG. 2C. A heat sink 60, such as a heat pipe or a radiator, is positioned with the heat sink assembly 24b between the heat sink 60 and the solid state power amplifier 56. Heat flows vertically from the solid state power amplifier 56, through the heat sink assembly 24b, and into the heat sink 60. Cavities 62 which function as microwave waveguides are machined into the base 58/casing 28b, and external waveguides 64 are in communication with the cavities 62. Microwaves are introduced into the electronic structure 20b through one of the waveguides 64a, conducted along one of the cavities 62a to the solid state power amplifier 56, amplified in the solid state power amplifier 56, conducted from the solid state power amplifier 56 along the other of the cavities 62b, and conducted away from the electronic structure 20b through the other of the waveguides 64b. The casing 28b may therefore serve as a part of the functional structure of the electronic structure 20b, in addition to its role in the heat sink assembly 24b.

FIG. 6 illustrates a preferred approach to fabricating the electronic structure 20. The elements of the heat sink assembly 24 are assembled as an initial assembly, numeral 80. That is, the pyrolytic graphite piece 26 and the disassembled elements of the casing 28 (such as the preforms 30 and 32 and lateral wall 36, where used) are assembled into the desired arrangement and held in place, usually with the help of appropriate tooling. This initial assembly is placed into a container for subsequent pressing, numeral 82. In the preferred approach, the container is a steel can that is initially closed on one end. The initial assembly is placed into the can through the open end. The interior of the can is evacuated, such as by placing the entire can into a vacuum chamber and evacuating the vacuum chamber. Preferably, the interior of the can is heated during the evacuation to a temperature of about 500° F. to about 600° F. to degas the interior of the can. While the interior of the can is evacuated, an end closure is welded in place, as by TIG welding. The evacuation of the interior of the can removes gaseous contaminants that otherwise might interfere with the intimate surface contact of the casing 28 and the pyrolytic graphite piece 26 during subsequent processing.

The can is placed into a hot isostatic pressing (HIP) apparatus and hot isostatically pressed, numeral 84, thereby hot isostatically pressing the initial assembly inside the can. In hot isostatic pressing, the article being hot isostatically pressed, here the can and the initial assembly inside the can, are heated to elevated temperature under an applied external pressure (while the interior of the can remains evacuated). In a preferred approach where the casing 28 is 6061 aluminum, the hot isostatic pressing is performed at a temperature of about 950° F. to about 1050° F., and an applied external pressure of from about 15,000 to about 60,000 pounds per square inch, in a cycle requiring 2 hours.

Heating to and cooling from the hot isostatic pressing temperature are performed in a quasi-equilibrium manner, so that the heat sink assembly remains at approximately the same temperature throughout. The larger the initial assembly, the slower the heating rate. In a typical case, however, the heating rate to, and the cooling rate from, the hot isostatic pressing temperature is from about 5 to about 6° F. per minute.

The quasi-equilibrium cooling is important in achieving a final structure where there is little or no residual thermal stresses between the casing 28 and the pyrolytic graphite piece 26. Such residual thermal stresses arise because of the different thermal expansion coefficients of the casing and the pyrolytic graphite piece. The residual stresses would be high if they were allowed to be created and remain during the cooling of the structure from the hot isostatic pressing temperature. In the present approach, the can and the hot isostatically pressed assembly therein are cooled sufficiently slowly that the residual stresses which would otherwise be present are relaxed by plastic deformation of the metal during cooling.

The attention paid to minimizing residual thermal stresses within the heat sink assembly 24 allows the heat sink assembly 24 to be made by hot isostatic pressing, hot pressing, or other elevated temperature technique. The pressing technique produces the intimate physical contact between the casing and the pyrolytic graphite piece as illustrated in FIG. 2A. The "intimate contact" is a close facing contact between the two materials, without intervening gap, structure, or material. The intimate contact improves the thermal transfer between the casing and the pyrolytic graphite piece, improving the thermal performance of the heat sink assembly. By contrast, in some prior approaches, such as that described in U.S. Pat. No. 5,296,310, the central heat conducting element was placed into a frame and allowed to slide relative to the frame to avoid buildup of shear stresses, an interface arrangement more like that illustrated in FIGS. 3B or 3C. While this technique does alleviate residual stresses, it also greatly reduces the thermal transfer rate at the interface between the casing and the pyrolytic graphite piece, an undesirable result. The present approach achieves acceptably low residual thermal stresses while also attaining an intimate bond between the casing and the pyrolytic graphite piece and thence improved thermal transfer properties. There is a concern with possible thermal stresses generated during service, but the present inventors have determined that these thermal stresses are not sufficiently large, over the temperature range experienced during service applications, to be of great concern. The present fabrication approach and the resulting electronic structure 20 are therefore highly satisfactory.

The hot isostatic pressing 84 is followed by an optional heat treating 86. If the material chosen for the casing requires heat treatment to achieve its desired properties—such as a quenching and aging treatment—that heat treatment is performed. The heat treatment may also include a final normalizing (i.e., slow cooling) treatment to aid in minimizing residual thermal stresses.

The heat sink assembly 24 is optionally final machined, numeral 88, and optionally final processed, numeral 90, as may be required for a particular electronic structure 20. In final machining, features such as the mounting holes 54 and the cavities 62 are machined into the casing 28. In final processing, the heat sink assembly is coated, plated (as with gold), cleaned, deburred, or otherwise final processed.

The electronic device 22, prepared separately according to procedures known for each particular type of electronic device, is affixed to the heat sink assembly 24 by any operable technique. The affixing may be accomplished, for example, using a curable adhesive, brazing, or the like.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An electronic structure, comprising:

an electronic device; and a heat sink assembly in thermal contact with the electronic device, the heat sink assembly comprising a piece of pyrolytic graphite embedded within a casing and bonded to an interior wall of the casing.

2. The electronic structure of claim 1, wherein the heat sink assembly comprises a first preform, a second preform oriented parallel to the first preform, and the piece of pyrolytic graphite disposed between and intimately contacting the first preform and the second preform.

3. The electronic structure of claim 2, wherein the piece of pyrolytic graphite has a high conductivity plane, and wherein the high conductivity plane lies parallel to a plane of the first preform.

4. The electronic structure of claim 2, wherein the piece of pyrolytic graphite has a high conductivity plane, and wherein the high conductivity plane lies at an angle of from more than 0 to 90 degrees to a plane of the first preform.

5. The electronic structure of claim 2, wherein the piece of pyrolytic graphite has a high conductivity plane, and wherein the high conductivity plane lies at an angle of about 90 degrees to a plane of the first preform.

6. The electronic structure of claim 1, wherein the heat sink assembly comprises a first preform, a second preform, a piece of pyrolytic graphite disposed between and intimately contacting the first preform and the second preform, the piece of pyrolytic graphite having a lateral periphery, and a lateral wall enclosing the periphery of the piece of pyrolytic graphite and joined to the preforms.

7. The electronic structure of claim 1, wherein the casing is a metal.

8. The electronic structure of claim 1, wherein the casing comprises a metal selected from the group consisting of aluminum, copper, and silver, and alloys thereof.

9. The electronic structure of claim 1, wherein the casing is hermetic.

10. The electronic structure of claim 1, wherein the electronic device is an integrated circuit.

11. An electronic structure, comprising:

an electronic device; and a heat sink assembly in thermal contact with the electronic device, the heat sink assembly comprising a piece of pyrolytic graphite embedded within a metallic casing and bonded to an interior wall of the metallic casing, wherein the heat sink assembly comprises a first preform, a second preform, The piece of pyrolytic graphite disposed between and intimately contacting the first preform and the second preform, the piece of pyrolytic graphite having a lateral periphery, and a lateral wall enclosing the lateral periphery of the piece of pyrolytic graphite and joined to the preforms.

12. The electronic structure of claim 11, wherein the piece of pyrolytic graphite has a high conductivity plane, and wherein the high conductivity plane lies parallel to a plane of the first preform.

13. The electronic structure of claim 11, wherein the piece of pyrolytic graphite has a high conductivity plane, and wherein the high conductivity plane lies at an angle of from more than 0 to 90 degrees to a plane of the first preform.

14. The electronic structure of claim 11, wherein the piece of pyrolytic graphite has a high conductivity plane, and wherein the high conductivity plane lies at an angle of about 90 degrees to a plane of the first preform.

* * * * *